United States Patent
Lei et al.

(10) Patent No.: US 10,497,879 B2
(45) Date of Patent: Dec. 3, 2019

(54) ORGANIC LIGHT-EMITTING DISPLAY PANEL DEVICE

(71) Applicants: Shanghai Tianma AM-OLED Co., Ltd., Shanghai (CN); TIANMA MICRO-ELECTRONICS CO., LTD., Shenzhen (CN)

(72) Inventors: Zhihong Lei, Shanghai (CN); Jinghua Niu, Shanghai (CN); Xiangcheng Wang, Shanghai (CN); Lei Lv, Shanghai (CN)

(73) Assignees: Shanghai Tianma AM-OLED Co., Ltd., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 113 days.

(21) Appl. No.: 15/616,941

(22) Filed: Jun. 8, 2017

(65) Prior Publication Data

US 2017/0309833 A1 Oct. 26, 2017

(30) Foreign Application Priority Data

Dec. 28, 2016 (CN) .......................... 2016 1 1236780

(51) Int. Cl.
*H01L 51/50* (2006.01)
*H01L 51/52* (2006.01)
*H01L 51/00* (2006.01)

(52) U.S. Cl.
CPC ........ *H01L 51/0072* (2013.01); *H01L 51/506* (2013.01); *H01L 51/5012* (2013.01); *H01L 51/5072* (2013.01); *H01L 51/5076* (2013.01); *H01L 51/5088* (2013.01); *H01L 51/5092* (2013.01); *H01L 51/5206* (2013.01); *H01L 51/5221* (2013.01); *H01L 2251/301* (2013.01); (Continued)

(58) Field of Classification Search
CPC ............. H01L 51/5012; H01L 51/5072; H01L 51/5076
See application file for complete search history.

(56) References Cited

U.S. PATENT DOCUMENTS

2004/0081836 A1* 4/2004 Inoue ...................... C04B 35/01
428/469
2006/0091791 A1* 5/2006 Shin .......................... C22C 5/06
313/503

(Continued)

FOREIGN PATENT DOCUMENTS

CN 103333158 A 10/2013
CN 104282722 A 1/2015
(Continued)

*Primary Examiner* — Tucker J Wright
*Assistant Examiner* — Wilner Jean Baptiste
(74) *Attorney, Agent, or Firm* — Kilpatrick Townsend & Stockton, LLP

(57) ABSTRACT

Embodiments of the present invention disclose an organic light-emitting display panel and an organic light-emitting display device. The organic light-emitting display panel includes: a first electrode, a hole injection layer, a light-emitting layer and a second electrode that are stacked in turn; wherein, the material of the hole injection layer includes an organic material and a conductive metal oxide, or the hole injection layer is formed by stacking an organic material film layer and a conductive metal oxide film layer.

14 Claims, 15 Drawing Sheets

(52) U.S. Cl.
CPC .. *H01L 2251/303* (2013.01); *H01L 2251/308* (2013.01); *H01L 2251/558* (2013.01)

(56) References Cited

U.S. PATENT DOCUMENTS

| | | | | |
|---|---|---|---|---|
| 2008/0237615 A1* | 10/2008 | Lee | ............... | H01L 51/5265 257/89 |
| 2009/0212688 A1* | 8/2009 | Song | ............... | H01L 51/508 313/504 |
| 2012/0242219 A1* | 9/2012 | Seo | ............... | C07D 409/10 313/504 |
| 2012/0256535 A1* | 10/2012 | Seo | ............... | C09K 11/06 313/504 |
| 2013/0153871 A1* | 6/2013 | Ma | ............... | H01L 51/504 257/40 |
| 2014/0034930 A1* | 2/2014 | Seo | ............... | H01L 51/5016 257/40 |
| 2016/0133880 A1* | 5/2016 | Lee | ............... | H01L 51/5281 257/40 |
| 2016/0181544 A1* | 6/2016 | Choi | ............... | C09K 11/06 257/40 |
| 2016/0254475 A1* | 9/2016 | Tsukamoto | ......... | H01L 51/5012 257/40 |

FOREIGN PATENT DOCUMENTS

| | | |
|---|---|---|
| CN | 104892578 A | 9/2015 |
| CN | 105118924 A | 12/2015 |

\* cited by examiner

ORGANIC LIGHT-EMITTING DISPLAY PANEL DEVICE

CROSS-REFERENCE TO RELATED APPLICATIONS

This application claims priority to Chinese Patent Application No. 201611236780.5, filed on Dec. 28, 2016 and entitled "ORGANIC LIGHT-EMITTING DISPLAY PANEL AND DEVICE", the disclosure of which is incorporated herein by reference in its entirety.

TECHNICAL FIELD

Embodiments of the present invention relate to organic light-emitting display technologies, and in particular, to an organic light-emitting display panel and an organic light-emitting display device.

BACKGROUND

Due to the technical advantages of no backlight source, high contrast, small thickness, large visual angle and fast reaction speed, etc., Organic Light-Emitting Display has become one of the important development directions of the display industries.

The existing organic light-emitting display panel includes: a cathode, an electron transport layer, a light-emitting layer, a hole transport layer, an anode and a substrate. During operation, a bias voltage is applied between the anode and the cathode of the organic light-emitting display panel, so that holes and electrons can break through the interfacial energy barrier and migrate respectively from the hole transport layer and the electron transport layer to the light-emitting layer, and on the light-emitting layer, electrons and holes are recombined to generate excitons. The excitons are unstable, and energy can be released. The energy is transferred to the molecules of the organic light-emitting material in the light-emitting layer, so that the molecules transit from a ground state to an excited state. The excited state is very unstable, and thus the excited molecules return to the ground state from the excited state, so that a light emitting phenomenon appears due to radiative transition. In the organic light-emitting display panel, the number of injected carriers as well as the lightness and efficiency of the organic light-emitting display panel are determined by the interfacial energy barrier between the organic material and the electrodes. However, in the existing organic light-emitting display panel, due to the too high interfacial energy barrier between the hole injection layer and the anode, the injection capacity of holes is small, which will cause the poor performance of the organic light-emitting display panel.

SUMMARY

Embodiments can provide an organic light-emitting display panel and an organic light-emitting display device, in order to lower the interfacial energy barrier between the hole injection layer and the anode and hence improve the performance of the organic light-emitting display panel In a first aspect, embodiments of the application provide an organic light-emitting display panel, which includes:
a first electrode, a hole injection layer, a light-emitting layer and a second electrode that are stacked in turn;
wherein, the material of the hole injection layer includes an organic material and a conductive metal oxide, or the hole injection layer is formed by stacking an organic material film layer and a conductive metal oxide film layer.

In a second aspect, embodiments of the present invention further provide an organic light-emitting display device, which includes any of the organic light-emitting display panels according to the embodiments of the present invention.

In the embodiments of the present invention, by setting that the material of the hole injection layer includes an organic material and a conductive metal oxide, or the hole injection layer is formed by stacking an organic material film layer and a conductive metal oxide film layer, it can solve the problems of the existing organic light-emitting display panels that the interfacial energy barrier between the hole injection layer and the anode is too high and the performance of the organic light-emitting display panel is low, thereby lowering the interfacial energy barrier between the hole injection layer and the anode of the organic light-emitting display panel and improving the hole injection capacity and the performance of the organic light-emitting display panel.

DETAILED DESCRIPTION

The present invention will be further illustrated in detail in conjunction with the drawings and embodiments. It may be understood that, the specific embodiments described here are only for explaining, rather than limiting, the present invention. Additionally, it further needs to be noted that, for convenient description, the drawings only show the parts related to the disclosure, rather than the entire structure.

One embodiment of the present invention provides an organic light-emitting display panel. The organic light-emitting display panel includes: a first electrode, a hole injection layer, a light-emitting layer and a second electrode that are stacked in turn; where the material of the hole injection layer includes an organic material and a conductive metal oxide, or the hole injection layer is formed by stacking an organic material film layer and a conductive metal oxide film layer.

It may be known according to Fowler-Nordheim (FN) tunneling model that, by setting that the material of the hole injection layer includes an organic material and a conductive metal oxide or the hole injection layer is formed by stacking an organic material film layer and a conductive metal oxide film layer, the interfacial energy barrier between the hole injection layer and the anode may be lowered, and hence the hole injection capacity and the performance of the organic light-emitting display panel may be improved.

Figure 1A:
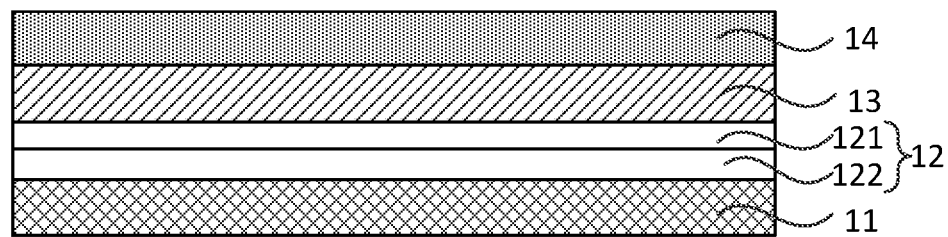
FIG. 1A is a structural representation of an organic light-emitting display panel according to one embodiment of the present invention.

FIG. 1A is a structural representation of an organic light-emitting display panel according to one embodiment of the present invention. Referring to FIG. 1A, the organic light-emitting display panel includes: a first electrode 11, a hole injection layer 12, a organic light-emitting layer 13 and a second electrode 14 that are stacked in turn. The hole injection layer 12 is formed by stacking an organic material film layer 121 and a conductive metal oxide film layer 122. The first electrode 11 is an anode, and the second electrode 14 is a cathode. It should be noted that, in specific arrangement, the organic material film layer 121 may be provided between the first electrode 11 and the conductive metal oxide film layer 122, or the conductive metal oxide film layer 122 may be provided between the first electrode 11 and the organic material film layer 121.

Figure 1B:
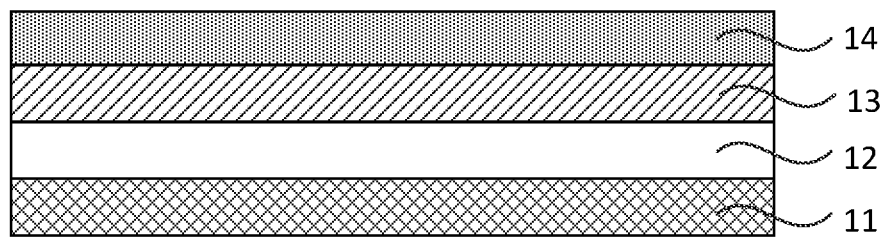
FIG. 1B is a structural representation of another organic light-emitting display panel according to one embodiment of the present invention.

FIG. 1B is a structural representation of another organic light-emitting display panel according to one embodiment of the present invention. In comparison with FIG. 1A, the material of the hole injection layer 12 includes an organic material and a conductive metal oxide in FIG. 1B.

The selection of the organic material and the conductive metal oxide in the hole injection layer 12 may vary. During specific manufacturing, Such a selection needs to be determined according to the performance requirement of the organic light-emitting display panel to be manufactured. For example, the organic material may be 2,3,6,7,10,11-hexacyano-1,4,5,8,9,12-hexaazatriphenylene (HAT-CN), and the conductive metal oxide may be molybdenum trioxide ($MnO_3$).

Because the bias voltage required by the organic light-emitting display panel can reflect the injection condition of holes, in order to avoid the influence of the injection of electrons at the side of the second electrode 14 in the organic light-emitting display panel on the injection condition of holes, a research will be made on the influence of the material of the hole injection layer 12 on the hole injection capacity by manufacturing four single carrier devices to replace the organic light-emitting display panel. The four single carrier devices are respectively device A, device B, device C and device D. The device A includes a tin indium oxide layer, a first buffer layer, a hole transport layer and a magnesium-silver alloy layer that are stacked in turn. The device B, the device C and the device D further include a second buffer layer as compared with the device A. Specifically, each of the device B, the device C and the device D can include a tin indium oxide layer, a first buffer layer, a hole transport layer, a second buffer layer and a magnesium-silver alloy layer that are stacked in turn. Here, the second buffer layer is equivalent to the hole injection layer 12 of the organic light-emitting display panel. The material of the second buffer layer in B is HAT-CN, the material of the second buffer layer in C is molybdenum trioxide, and the materials of the second buffer layer in D are molybdenum trioxide and HAT-CN. A research will be made on the hole injection capacity of the above four devices, and the result thereof will be shown in FIG. 2.

Figure 2:
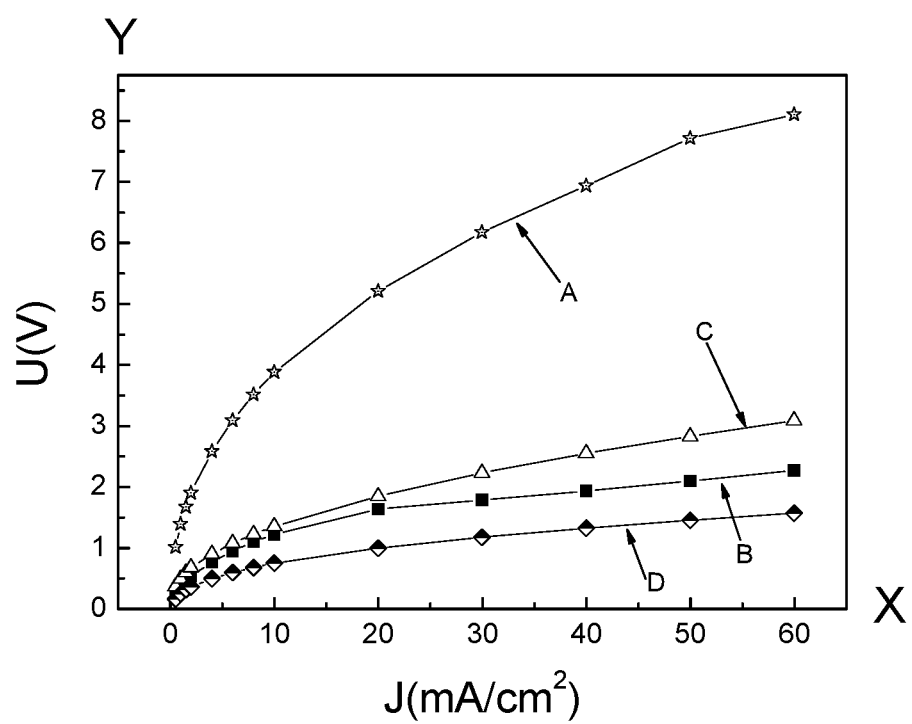
FIG. 2 is a comparison diagram of the performance curves of single carrier devices according to the embodiments of the present invention.

In FIG. 2, the X axis represents the current density J of the device, with a unit of milliampere per square centimeter ($mA/cm^2$), and the Y axis represents the bias voltage U that needs to be applied to the device, with a unit of volt (V). Referring to FIG. 2, under the same current density J, the bias voltage U required for the device (including the device B, the device C and the device D) having the second buffer layer (which is equivalent to the hole injection layer 12 of the organic light-emitting display panel) is much lower than the bias voltage required for the device A without such the second buffer layer. This indicates that the arrangement of the second buffer layer positively helps to lower the interfacial energy barrier, and hence facilitates the injection of holes. Additionally, under the same current density J, the bias voltage U required for the device D is lower than the bias voltage U required for the device B; and also, the bias voltage U required for the device B is lower than the bias voltage U required for the device C. Thus, the ordering according to the hole injection capacities in the organic light-emitting display panel from large to small is as follows: the device D>the device B>the device C>the device A. This indicates that, the arrangement in which the material of the second buffer layer includes an organic material and a conductive metal oxide positively indeed helps to further lower the interfacial energy barrier, and hence facilitates the injection of more holes and the lowering of the working voltage (i.e., the bias voltage U) of the device.

A research shows that, if the volume ratio of molybdenum trioxide to HAT-CN in the hole injection layer 12 is changed, the performance parameter of the organic light-emitting display panel will be changed. In specific arrangement, appropriate volume ratio of molybdenum trioxide to HAT-CN may be selected according to the performance requirement of the organic light-emitting display panel to be manufactured, which will not be limited in this application. Exemplarily, the volume ratio of molybdenum trioxide to HAT-CN in the hole injection layer 12 may be in the range of 1:2 to 2:1.

Figure 3A:
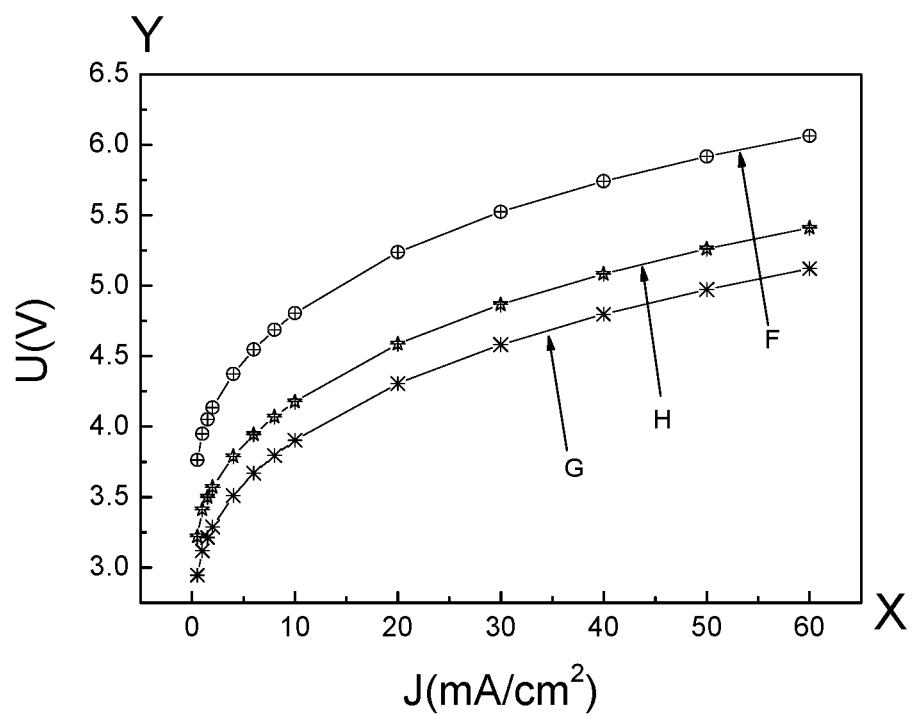
FIG. 3A-FIG. 3C are comparison diagrams of the performance curves of different organic light-emitting display panels according to the embodiments of the present invention.
Figure 3B:
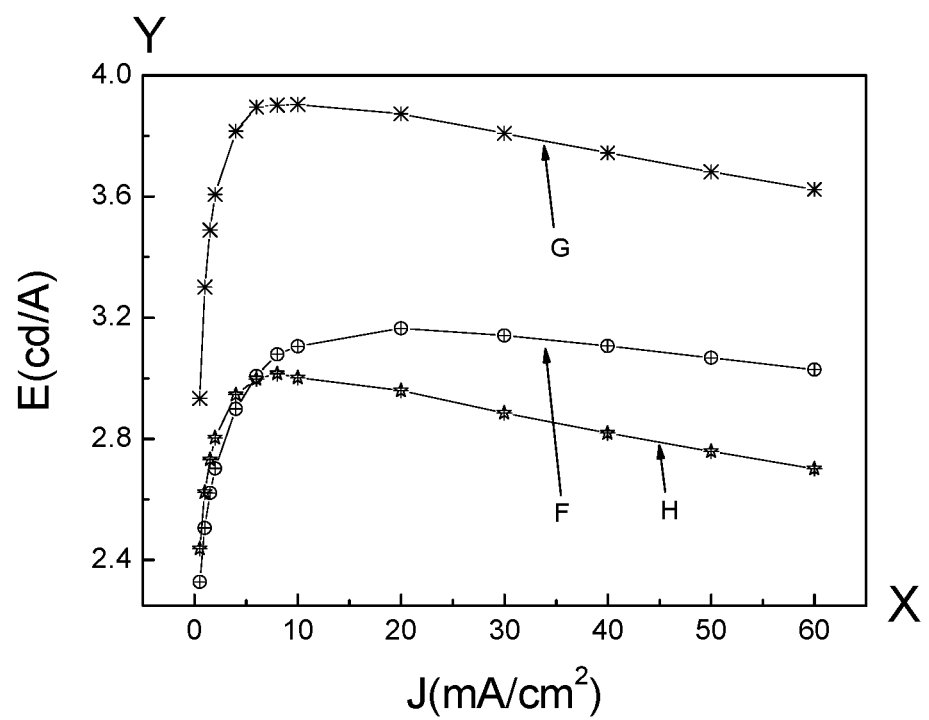
Figure 3C:
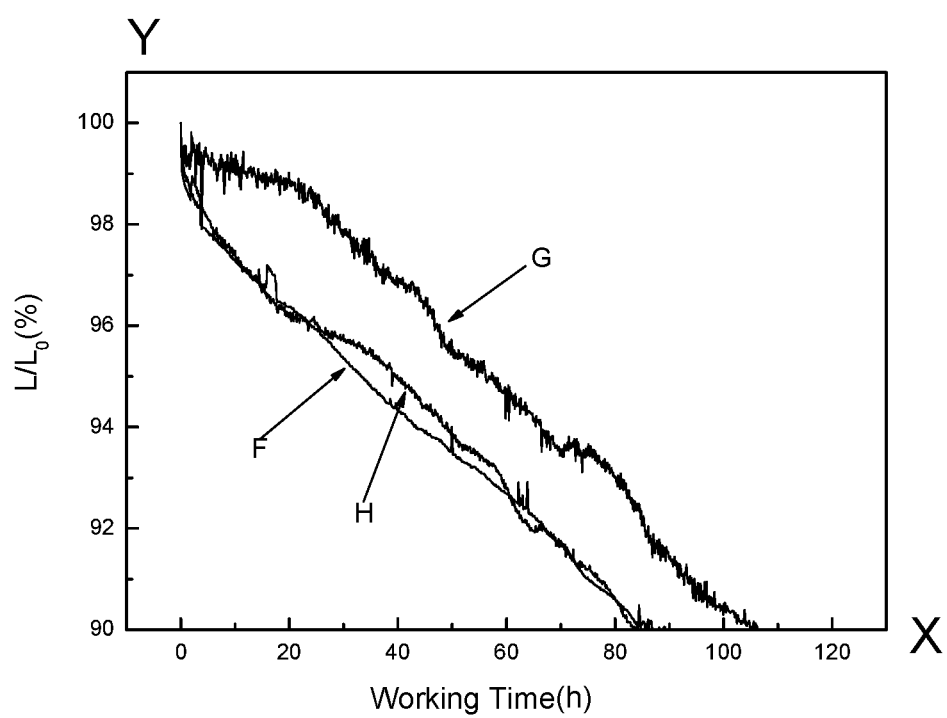

FIG. 3A-FIG. 3C are comparison diagrams of the performance curves of different organic light-emitting display panels according to the embodiments of the present invention. In FIG. 3A-FIG. 3C, F represents an organic light-emitting display panel in which the volume ratio of molybdenum trioxide to HAT-CN in the hole injection layer 12 is 2:1, G represents an organic light-emitting display panel in which the volume ratio of molybdenum trioxide to HAT-CN in the hole injection layer 12 is 1:1, and H represents an organic light-emitting display panel in which the volume ratio of molybdenum trioxide to HAT-CN in the hole injection layer 12 is 1:2.

In FIG. 3A, X axis represents the current density J of the organic light-emitting display panel, with a unit of milliampere per square centimeter ($mA/cm^2$), and Y axis represents the bias voltage U that needs to be applied to the organic light-emitting display panel, with a unit of volt (V). As shown in FIG. 3A, under the same current density J, the ordering according to the bias voltage U required by the organic light-emitting display panel from small to large is as follows: the organic light-emitting display panel G<the organic light-emitting display panel H<the organic light-emitting display panel F. This indicates that, in comparison with the organic light-emitting display panel F in which the volume ratio of molybdenum trioxide to HAT-CN in the hole injection layer 12 is 2:1 and the organic light-emitting display panel H in which the volume ratio of molybdenum trioxide to HAT-CN in the hole injection layer 12 is 1:2, the interfacial energy barrier of the organic light-emitting display panel G in which the volume ratio of molybdenum trioxide to HAT-CN in the hole injection layer 12 is 1:1 is lower, which is more favorable for injecting more holes from the first electrode 11 and facilitates the carrier balance in the organic light-emitting display panel, thereby lowering the working voltage (i.e., the bias voltage U) of the organic light-emitting display panel.

In FIG. 3B, X axis represents the current density J of the organic light-emitting display panel, with a unit of milliampere per square centimeter (mA/cm$^2$), and Y axis represents the light-emitting efficiency E of the organic light-emitting display panel, with a unit of candela per ampere (cd/A). Referring to FIG. 3B, under the same current density J, the ordering according to the light-emitting efficiency of the organic light-emitting display panel from large to small is as follows: the organic light-emitting display panel G>the organic light-emitting display panel F>the organic light-emitting display panel H. This indicates that, in comparison with the organic light-emitting display panel F in which the volume ratio of molybdenum trioxide to HAT-CN in the hole injection layer 12 is 2:1 and the organic light-emitting display panel H in which the volume ratio of molybdenum trioxide to HAT-CN in the hole injection layer 12 is 1:2, the light-emitting efficiency of the organic light-emitting display panel G in which the volume ratio of molybdenum trioxide to HAT-CN in the hole injection layer 12 is 1:1 is higher.

In FIG. 3C, the X axis represents the working time of the organic light-emitting display panel, with a unit of hour (h), and Y axis represents a ratio of the light-emitting lightness L to the initial lightness $L_0$ of the organic light-emitting display panel. Referring to FIG. 3C, during the process in which the lightness L of the organic light-emitting display panel attenuates from the initial lightness $L_0$ (corresponding to the vertical coordinate of 100) to 90% of the initial lightness $L_0$ (corresponding to the vertical coordinate of 90), the working time of the improved organic light-emitting display panel G is larger than the working time of the organic light-emitting display panel F, and the working time of the organic light-emitting display panel G is larger than the working time of the organic light-emitting display panel H. This indicates that, in comparison with the organic light-emitting display panel F in which the volume ratio of molybdenum trioxide to HAT-CN in the hole injection layer 12 is 2:1 and the organic light-emitting display panel H in which the volume ratio of molybdenum trioxide to HAT-CN in the hole injection layer 12 is 1:2, the lifetime of the organic light-emitting display panel G in which the volume ratio of molybdenum trioxide to HAT-CN in the hole injection layer 12 is 1:1 is longer.

In conclusion, in specific arrangement, optionally, the volume ratio of molybdenum trioxide to HAT-CN in the hole injection layer 12 is 1:1.

Figure 4:
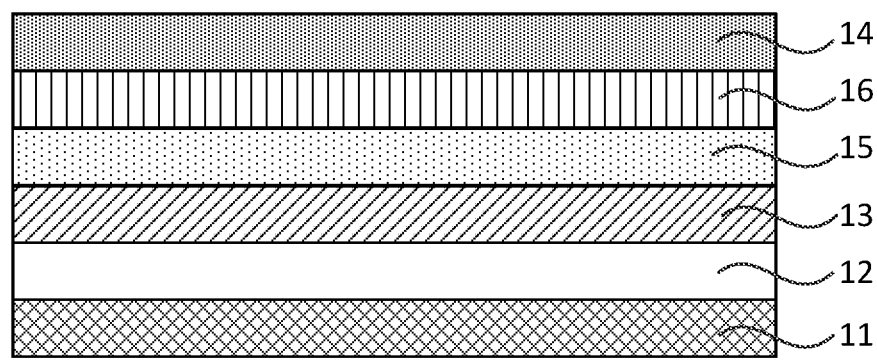
FIG. 4 is a structural representation of yet another organic light-emitting display panel according to one embodiment of the present invention.

FIG. 4 is a structural representation of another organic light-emitting display panel according to one embodiment of the present invention. In comparison with FIG. 1, the organic light-emitting display panel further includes an electron transport layer 15 and an electron injection layer 16. Specifically, referring to FIG. 4, the electron transport layer 15 is located between the second electrode 14 and the organic light-emitting layer 13. The electron injection layer 16 is located between the second electrode 14 and the electron transport layer 15. Moreover, in order to improve the electron injection capacity of the organic light-emitting display panel, optionally, at least one of the electron transport layer 15, the electron injection layer 16 and the second electrode 14 is doped with at least one of an alkali metal, an alkaline earth metal and a rare earth metal. For example, at least one of the electron transport layer 15, the electron injection layer 16 and the second electrode 14 is doped with at least one of cesium, lithium, rubidium, calcium, magnesium, barium, ytterbium and samarium.

Figure 5A:
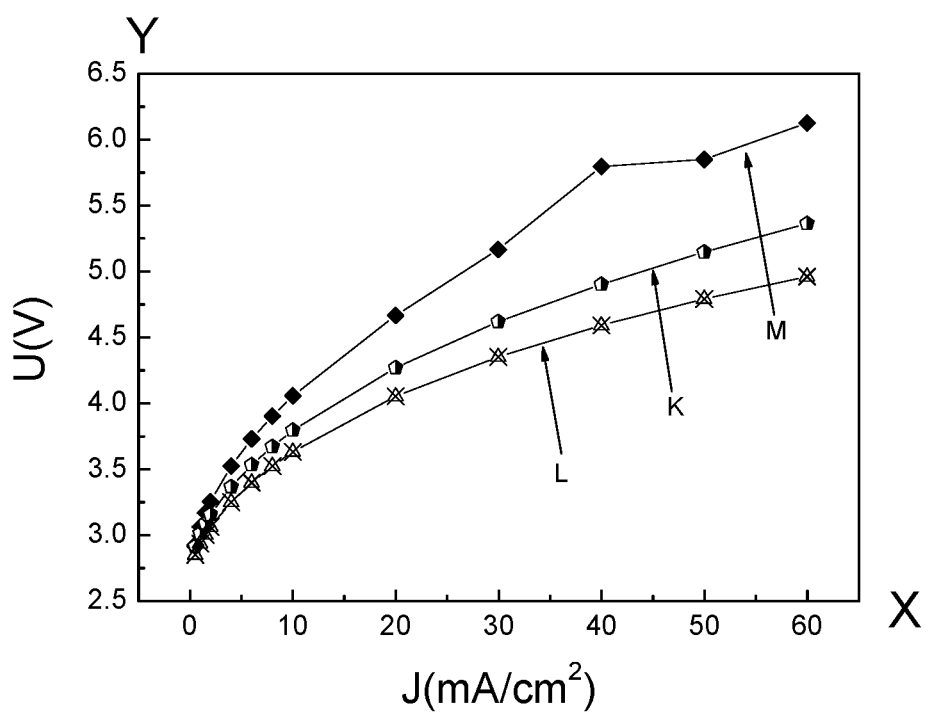
FIG. 5A-FIG. 5C are comparison diagrams of the performance curves of different organic light-emitting display panels according to the embodiments of the present invention.
Figure 5B:
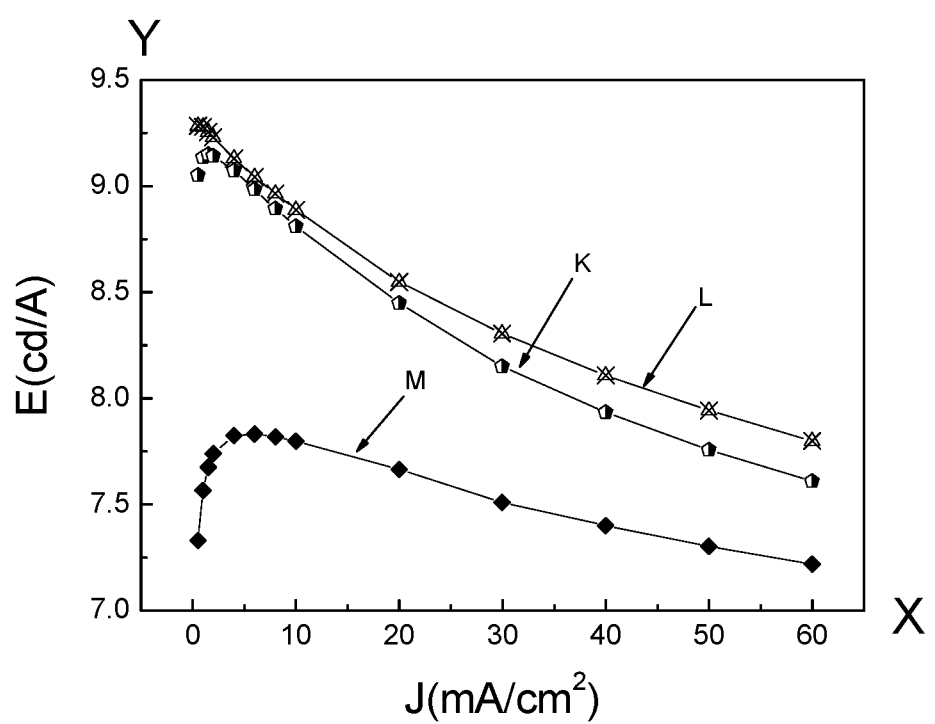
Figure 5C:
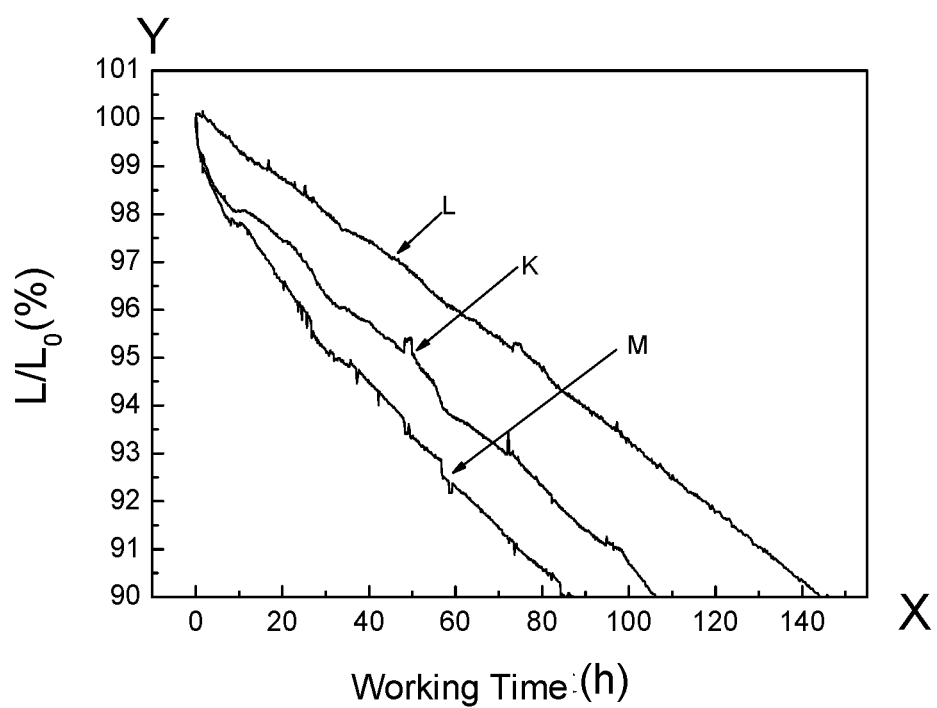

Next, a research will be made on the performance of the doped organic light-emitting display panel by an example in which the electron transport layer 15 of an organic light-emitting display panel is doped with at least one of an alkali metal, an alkaline earth metal and a rare earth metal. FIG. 5A-FIG. 5C are comparison diagrams of the performance curves of different organic light-emitting display panels according to the embodiments of the present invention. In FIG. 5A-FIG. 5C, M represents an organic light-emitting display panel in which the electron transport layer 15 is not doped with an alkali metal, an alkaline earth metal or a rare earth metal, K represents an organic light-emitting display panel in which the electron transport layer 15 is doped with 8-hydroxyquinolinolato-lithium, and L represents an organic light-emitting display panel in which the electron transport layer 15 is doped with ytterbium. It should be noted that, the material of the hole injection layer 12 in the organic light-emitting display panel M, the organic light-emitting display panel K and the organic light-emitting display panel L includes molybdenum trioxide and HAT-CN, and the volume ratio of molybdenum trioxide to HAT-CN is 1:1.

In FIG. 5A, X axis represents the current density J of the organic light-emitting display panel, with a unit of milliampere per square centimeter (mA/cm$^2$), and Y axis represents the bias voltage U that needs to be applied to the organic light-emitting display panel, with a unit of volt (V). As shown in FIG. 5A, under the same current density J, the ordering according to the bias voltage U required by the organic light-emitting display panel from small to large is as follows: the organic light-emitting display panel L<the organic light-emitting display panel K<the organic light-emitting display panel M. This indicates that doping the electron injection layer 16 with at least one of an alkali metal, an alkaline earth metal and a rare earth metal positively facilitates improving the injection capacity of electrons and facilitates the carrier balance in the organic light-emitting display panel, thereby lowering the working voltage (i.e., the bias voltage U) of the organic light-emitting display panel. Moreover, in comparison with the organic light-emitting display panel K in which the electron transport layer 15 is doped with 8-hydroxyquinolinolato-lithium, the injection capacity of electrons of the organic light-emitting display panel L in which the electron transport layer 15 is doped with ytterbium is higher.

In FIG. 5B, X axis represents the current density J of the organic light-emitting display panel, with a unit of milliampere per square centimeter (mA/cm$^2$), and Y axis represents the light-emitting efficiency E of the organic light-emitting display panel, with a unit of candela per ampere (cd/A). Referring to FIG. 5B, under the same current density J, the ordering according to the light-emitting efficiency of the organic light-emitting display panel from large to small is as follows: the organic light-emitting display panel L>the organic light-emitting display panel K>the organic light-emitting display panel M. This indicates that doping the electron transport layer 15 with at least one of an alkali metal, an alkaline earth metal and a rare earth metal positively facilitates improving the light-emitting efficiency of the organic light-emitting display panel. Moreover, in comparison with the organic light-emitting display panel K in which the electron transport layer 15 is doped with 8-hydroxyquinolinolato-lithium, the organic light-emitting display panel L in which the electron transport layer 15 is doped with ytterbium has a higher light-emitting efficiency.

In FIG. 5C, the X axis represents the working time of the organic light-emitting display panel, with a unit of hour (h), and Y axis represents a ratio of the light-emitting lightness L to the initial lightness $L_0$ of the organic light-emitting display panel. Referring to FIG. 5C, during the process in which the lightness L of the organic light-emitting display panel attenuates from the initial lightness $L_0$ (corresponding to the vertical coordinate of 100) to 90% of the initial lightness $L_0$ (corresponding to the vertical coordinate of 9), the working time of the organic light-emitting display panel L>the working time of the organic light-emitting display panel K>the working time of the organic light-emitting display panel M. This indicates that doping the electron transport layer 15 with at least one of an alkali metal, an alkaline earth metal and a rare earth metal positively facilitates prolonging the lifetime of the organic light-emitting display panel. In comparison with the organic light-emitting display panel K in which the electron transport layer 15 is doped with 8-hydroxyquinolinolato-lithium, the organic light-emitting display panel L in which the electron transport layer 15 is doped with ytterbium is more favorable for prolonging the lifetime of the organic light-emitting display panel.

In conjunction with FIGS. 3A-3C and FIGS. 5A-5B, it may be found that, when the material of the hole injection layer 12 in the organic light-emitting display panel includes molybdenum trioxide and HAT-CN with the volume ratio of molybdenum trioxide to HAT-CN being 1:1 and the electron transport layer 15 is doped with ytterbium, the overall performance of the organic light-emitting display panel will be excellent. Such organic light-emitting display panel has main advantages such as a low bias voltage required in operation, a high light-emitting efficiency and a long lifetime.

Based on each of the above technical solutions, optionally, the first electrode 11 and/or the second electrode 14 may be set as a light exit side electrode of organic light-emitting display panel. If only the first electrode 11 is the light exit side electrode of the organic light-emitting display panel or only the second electrode 14 is the light exit side electrode of the organic light-emitting display panel, the organic light-emitting display panel will be a unilateral light-emitting type organic light-emitting display panel. If the first electrode 11 and the second electrode 14 are both the light exit side electrodes of organic light-emitting display panel, the organic light-emitting display panel will be a bilateral light-emitting type organic light-emitting display panel.

Figure 6:
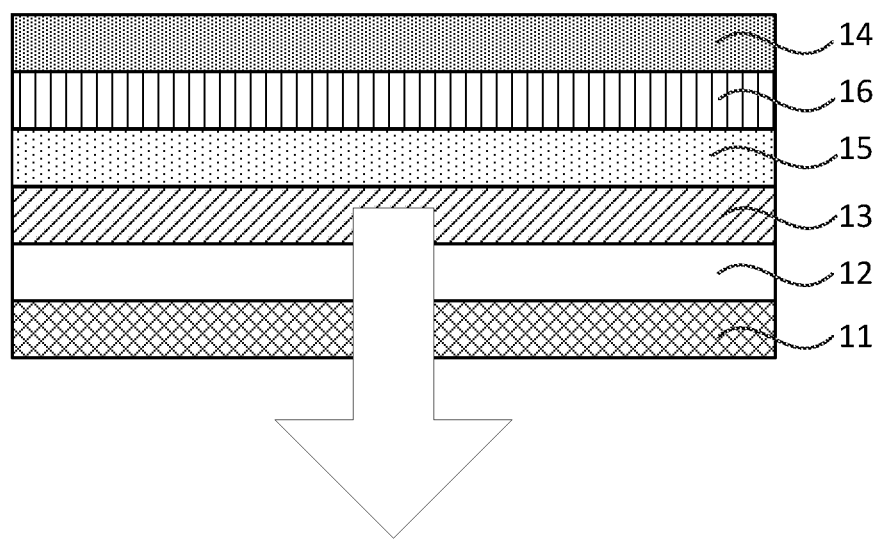
FIG. 6 is a structural representation of yet another organic light-emitting display panel according to one embodiment of the present invention.

FIG. 6 is a structural representation of yet another organic light-emitting display panel according to one embodiment of the present invention. Referring to FIG. 6, in the organic light-emitting display panel, the first electrode 11 functions as a light exit side electrode of organic light-emitting display panel, and after being formed on the organic light-emitting layer 13, the light is emitted out via the first electrode 11. Specifically, the material of the first electrode 11 is a conductive transparent material, and the material of the second electrode 14 may be silver or an alloy containing silver. Optionally, during specific design, the material and thickness of the first electrode 11 may vary, so long as it can guarantee that the first electrode 11 has a good hole injection capacity and a good light transmittance. For example, the material for forming the conductive transparent film of the first electrode 11 may be tin indium oxide, zinc indium oxide or a mixture of aluminium oxide and zinc oxide. The thickness of the second electrode 14 may vary, so long as it can guarantee that the second electrode 14 has a good electron injection capacity and a good reflection effect. For example, the material of the second electrode 14 may be an alloy containing silver, where the volume percent of silver is greater than or equal to 80%, and the thickness of the second electrode 14 may be 50 nm-150 nm. In this thickness range, the light formed on the organic light-emitting layer 13 may be emitted out from the first electrode 11 after being reflected.

Figure 7:
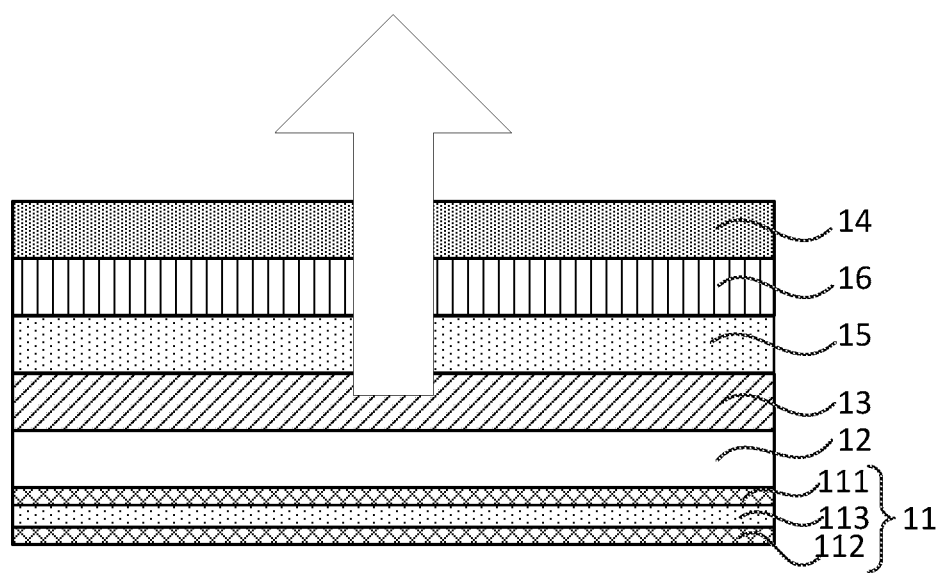
FIG. 7 is a structural representation of yet another organic light-emitting display panel according to one embodiment of the present invention.

FIG. 7 is a structural representation of yet another organic light-emitting display panel according to one embodiment of the present invention. Referring to FIG. 7, in the organic light-emitting display panel, the second electrode 14 functions as a light exit side electrode of organic light-emitting display panel, and after being formed on the organic light-emitting layer 13, the light is emitted out via the second electrode 14. The material of the second electrode 14 is silver or an alloy containing silver. The material and thickness of the second electrode 14 may vary, so long as it can guarantee that the second electrode 14 has a good electron injection capacity and a good light transmittance. For example, the material of the second electrode 14 may be an alloy containing silver, where the volume percent of silver is greater than or equal to 80%, and the thickness of the second electrode 14 may be 10 nm-20 nm. In this thickness range, the second electrode 14 has a certain transparency, and hence the light formed on the organic light-emitting layer 13 may be transmitted through the second electrode 14. The first electrode 11 may include a first conductive transparent film 111, a second conductive transparent film 112 and a reflective film 113 that is located between the first conductive transparent film 111 and the second conductive transparent film 112. During specific design, the material and thickness of each film layer of the first electrode 11 may vary, so long as it can guarantee the first electrode 11 has a good hole injection capacity and a good reflection effect. For example, the material of the first conductive transparent film 111 and the second conductive transparent film 112 in the first electrode 11 may be tin indium oxide, zinc indium oxide or a mixture of aluminium oxide and zinc oxide, the material of the reflective film 113 may be silver or an alloy containing silver, and the thickness of the reflective film 113 may be 50 nm-150 nm.

Figure 8:
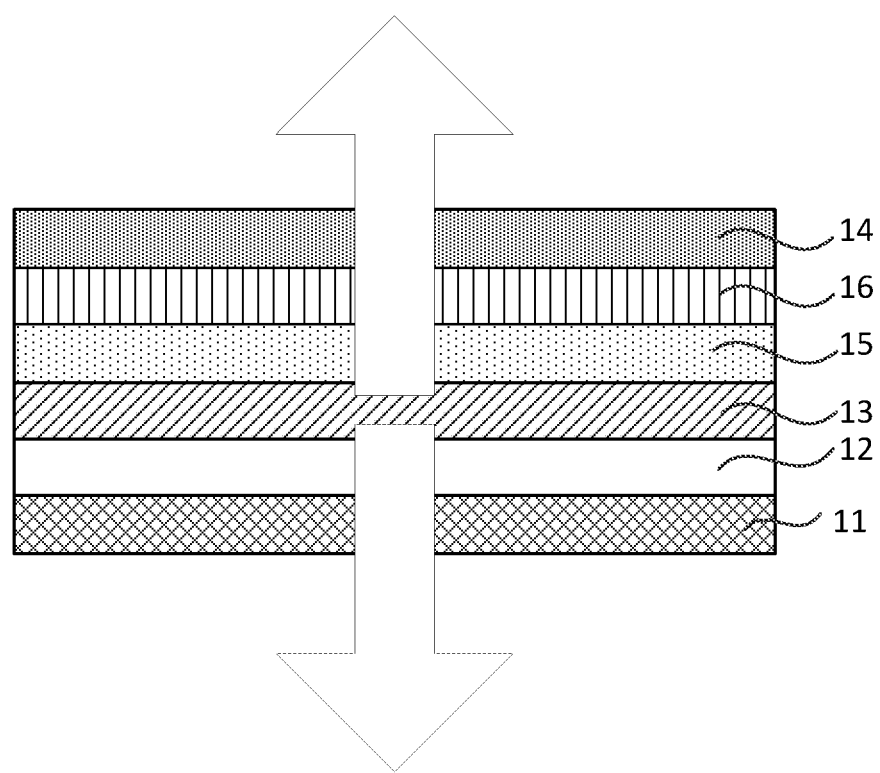
FIG. 8 is a structural representation of yet another organic light-emitting display panel according to one embodiment of the present invention.

FIG. 8 is a structural representation of yet another organic light-emitting display panel according to one embodiment of the present invention. Referring to FIG. 8, in the organic light-emitting display panel, the first electrode 11 and the second electrode 14 both function as a light exit side electrode. After being formed on the organic light-emitting layer 13, one part of the light is emitted out via the first electrode 11, and the other part of the light is emitted out via the second electrode 14. Specifically, the material of the first electrode 11 is a conductive transparent material. Optionally, during specific design, the material and thickness of the first electrode 11 may vary, so long as it can guarantee that the first electrode 11 has a good hole injection capacity and a good light transmittance. For example, the material for forming the conductive transparent film of the first electrode 11 may be tin indium oxide, zinc indium oxide or a mixture of aluminium oxide and zinc oxide. The material of the second electrode 14 is silver or an alloy containing silver. The material and thickness of the second electrode 14 may vary, so long as it can guarantee that the second electrode 14 has a good electron injection capacity and a good light transmittance. For example, the material of the second electrode 14 may be an alloy containing silver, where the volume percent of silver is greater than or equal to 80%, and the thickness of the second electrode 14 may be 10 nm-20 nm. In this thickness range, the second electrode 14 has a certain transparency, and hence the light formed on the organic light-emitting layer 13 may be transmitted through the second electrode 14.

Figure 9:
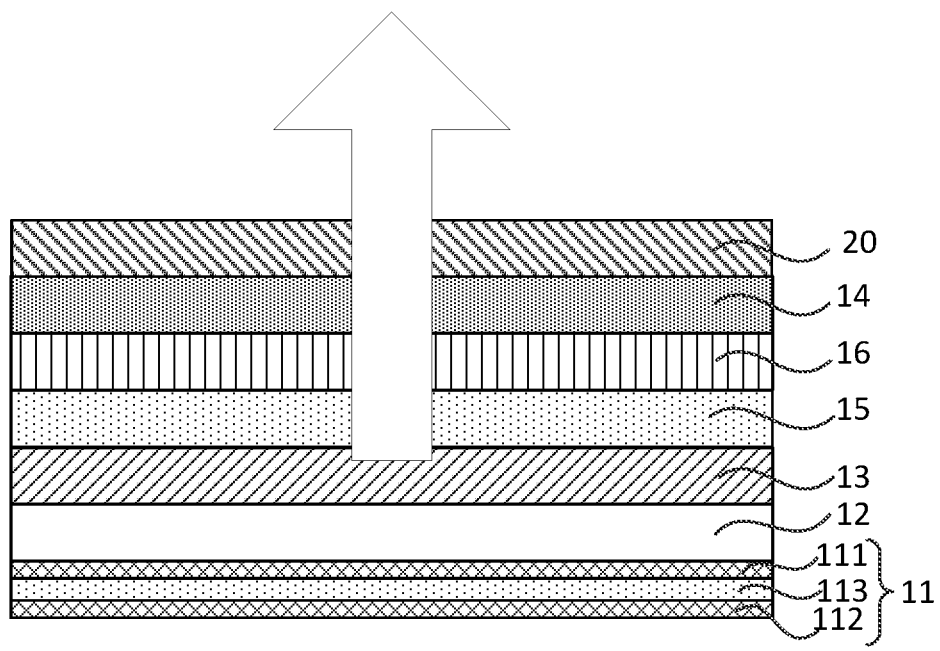
FIG. 9 is a structural representation of yet another organic light-emitting display panel according to one embodiment of the present invention.

FIG. 9 is a structural representation of yet another organic light-emitting display panel according to one embodiment of the present invention. Optionally, as shown in FIG. 9, the organic light-emitting display panel may further include an optical coupling layer 20. The optical coupling layer 20 is located on one side of the light exit side electrode (the second electrode 14) of the organic light-emitting display panel away from the organic light-emitting layer 13. If the organic light-emitting display panel does not include the optical coupling layer 20, the process in which the light is emitted from the light exit side electrode (the second electrode 14) into the air will essentially be a process in which the light is emitted from an optically denser medium into an optically thinner medium. The light tends to be reflected at the interface between the light exit side electrode (the second electrode 14) and the air, and hence the light transmittance will be low. In the technical solutions of this application, the essence of providing the optical coupling layer 20 is to change the refractive index of the contact surface between the light exit side of the organic light-emitting display panel and the air so as to suppress the reflection of light, thereby improving the light transmittance. Moreover, the transmittance of the light exit side electrode is 30%-50%, and the total transmittance of the light exit side electrode (the second electrode 14) and the optical coupling layer 20 is greater than or equal to 65%.

It should be noted that, during the manufacturing process of each organic light-emitting display panel provided in this application, the first electrode 11 may be first formed on the substrate, then the film layers located between the first electrode 11 and the second electrode 14 may be formed in turn, and finally the second electrode 14 is formed; or, the second electrode 14 may be first formed on the substrate, then the film layers located between the first electrode 11 and the second electrode 14 may be formed in turn, and finally the first electrode 11 is formed. That is, the organic light-emitting display panel may have an upright structure, or it may have an inverted structure.

Figure 10:
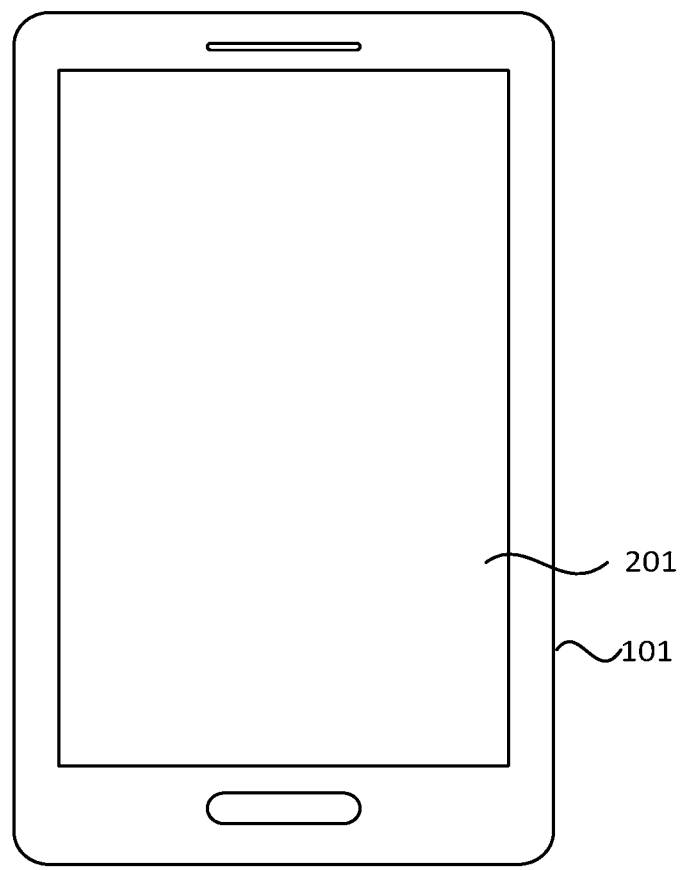
FIG. 10 is a structural representation of an organic light-emitting display device according to one embodiment of the present invention

Embodiments of the present invention further provide an organic light-emitting display device. FIG. 10 is a structural representation of an organic light-emitting display device according to one embodiment of the present invention. Referring to FIG. 10, the organic light-emitting display device 101 includes any of the organic light-emitting display panels 201 according to the embodiments of the present invention. Specifically, the organic light-emitting display device may be a mobile phone, a notebook computer, an intelligent wearable device and an information inquiry machine in a public hall.

In the embodiments of the present invention, by setting that the material of the hole injection layer includes an organic material and a conductive metal oxide, or the hole injection layer is formed by stacking an organic material film layer and a conductive metal oxide film layer, it can solve the problems of the existing organic light-emitting display panels that the interfacial energy barrier between the hole injection layer and the anode is too high and the performance of the organic light-emitting display panel is low, thereby lowering the interfacial energy barrier between the hole injection layer and the anode of the organic light-emitting display panel and hence improving the hole injection capacity and the performance of the organic light-emitting display panel.

It should be noted that the embodiments of the present invention and the technical principles used therein are described as above. It should be appreciated that the invention is not limited to the particular embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. An organic light-emitting display panel, comprising:
a first electrode, wherein the first electrode is an anode electrode,
a hole injection layer stacked on the first electrode,
a light-emitting layer stacked on the hole injection layer,
an electron transport layer stacked on the light-emitting layer,
an electron injection layer stacked on the electron transport layer, and
a second electrode stacked on the electron injection layer, wherein the second electrode is a cathode electrode,
wherein a material of the hole injection layer comprises an organic material and a conductive metal oxide, or the hole injection layer is formed by stacking an organic material film layer and a conductive metal oxide film layer,
wherein the material of the hole injection layer comprises molybdenum trioxide and 2,3,6,7,10,11-hexacyano-1,4,5,8,9,12-hexaazatriphenylene (HAT-CN), and the volume ratio of the molybdenum trioxide to the HAT-CN in the hole injection layer is 1:1, wherein the electron transport layer is doped with ytterbium.

2. The organic light-emitting display panel according to claim 1, wherein
at least one of the electron injection layer and the second electrode is doped with at least one of an alkali metal, an alkaline earth metal and a rare earth metal.

3. The organic light-emitting display panel according to claim 1, wherein
at least one of the first electrode and the second electrode is a light exit side electrode of the organic light-emitting display panel.

4. The organic light-emitting display panel according to claim 3, wherein
the first electrode is the light exit side electrode of the organic light-emitting display panel; and
a material of the first electrode is a conductive transparent material.

5. The organic light-emitting display panel according to claim 3, wherein
the second electrode is the light exit side electrode of the organic light-emitting display panel; and
a material of the second electrode is silver or an alloy containing silver.

6. The organic light-emitting display panel according to claim 4, wherein, a material of the second electrode is silver or an alloy containing silver.

7. The organic light-emitting display panel according to claim 5, wherein
the material of the second electrode is an alloy containing silver, wherein a volume percent of silver is greater than or equal to 80%.

8. The organic light-emitting display panel according to claim 5, wherein
a thickness of the second electrode is 10 nm-20 nm.

9. The organic light-emitting display panel according to claim 5, wherein
the first electrode comprises a first conductive transparent film, a second conductive transparent film and a reflective film located between the first conductive transparent film and the second conductive transparent film.

10. The organic light-emitting display panel according to claim 9, wherein
a material of the first conductive transparent film and the second conductive transparent film is tin indium oxide, zinc indium oxide or a mixture of aluminium oxide and zinc oxide, and the material of the reflective film is silver or an alloy containing silver.

11. The organic light-emitting display panel according to claim 10, wherein
a thickness of the reflective film is 50 nm-150 nm.

12. The organic light-emitting display panel according to claim 5, further comprising an optical coupling layer, wherein the optical coupling layer is located on a side of the light exit side electrode of the organic light-emitting display panel away from the light-emitting layer.

13. The organic light-emitting display panel according to claim 12, wherein, a transmittance of the light exit side electrode is 30%-50%, and the total transmittance of the light exit side electrode and the optical coupling layer is greater than or equal to 65%.

14. An organic light-emitting display device, comprising an organic light-emitting display panel, wherein the organic light-emitting display panel comprises:
a first electrode, wherein the first electrode is an anode electrode,
a hole injection layer stacked on the first electrode,
a light-emitting layer stacked on the hole injection layer,
an electron transport layer stacked on the light-emitting layer,
an electron injection layer stacked on the electron transport layer, and
a second electrode stacked on the electron injection layer, wherein the second electrode is a cathode electrode,
wherein a material of the hole injection layer comprises an organic material and a conductive metal oxide, or the hole injection layer is formed by stacking an organic material film layer and a conductive metal oxide film layer,
wherein the material of the hole injection layer comprises molybdenum trioxide and 2,3,6,7,10,11-hexacyano-1,4,5,8,9,12-hexaazatriphenylene (HAT-CN), and the volume ratio of the molybdenum trioxide to the HAT-CN in the hole injection layer is 1:1, wherein the electron transport layer is doped with ytterbium.

* * * * *